United States Patent [19]

Huntley

[11] 4,353,039

[45] Oct. 5, 1982

[54] MONOLITHIC ASTABLE MULTIVIBRATOR CIRCUIT

[75] Inventor: Christopher R. Huntley, Burnaby, Canada

[73] Assignee: GTE Automatic Electric Laboratories, Inc., Northlake, Ill.

[21] Appl. No.: 150,371

[22] Filed: May 15, 1980

[51] Int. Cl.³ .................. H03B 5/36; H03K 3/282
[52] U.S. Cl. ..................... 331/113 R; 331/116 R; 331/117 R
[58] Field of Search ............ 331/113 R, 116 R, 117 R

[56] References Cited

U.S. PATENT DOCUMENTS 3,684,981  8/1972  Kreitz .................... 331/116 R
3,902,140  8/1975  Grebene ................. 331/113 R

FOREIGN PATENT DOCUMENTS 2202702  8/1972  Fed. Rep. of Germany ... 331/116 R

OTHER PUBLICATIONS

Luckau et al., "Integrated Quartz Oscillator Q052", Components Report, vol. 11, Nov. 1976, pp. 162–166.

Primary Examiner—Siegfried H. Grimm
Attorney, Agent, or Firm—Leonard R. Cool

[57] ABSTRACT

First and second NPN transistors are direct connected in an astable multivibrator configuration. Each collector is connected to the positive terminal of a DC power source through series connected diodes. A resistor, which is selected to control the amplitude of oscillation, is connected between the collectors. The frequency of oscillation is controlled by a frequency determining component which is connected between the emitters of said transistors. The emitters are connected to current sources.

5 Claims, 4 Drawing Figures

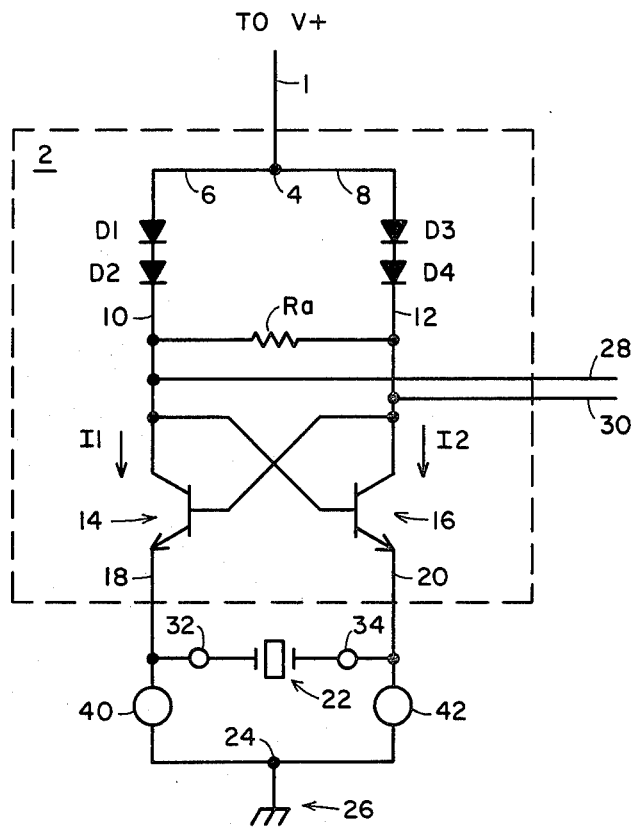
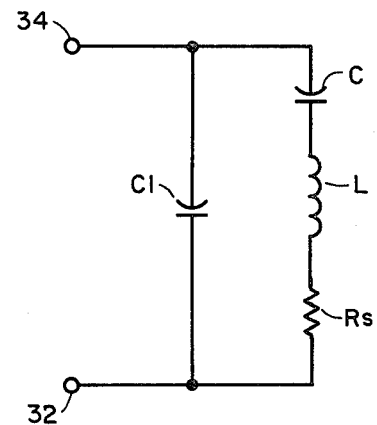
FIG. 2
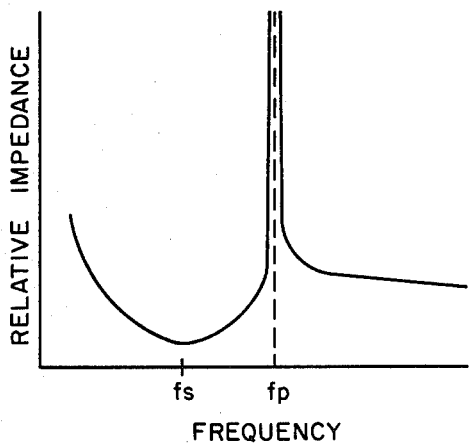
FIG. 3
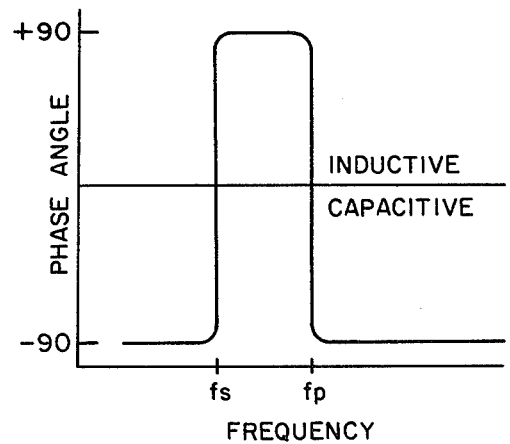
FIG. 4

MONOLITHIC ASTABLE MULTIVIBRATOR CIRCUIT

BACKGROUND OF INVENTION

This invention relates to oscillators and more particularly to monolithic astable circuits used in oscillators in which the frequency of oscillation is controlled by the series resonance of a piezoelectric crystal.

As is well known, an astable multivibrator is a circuit that generates a periodic non-sinusoidal signal, and the circuit does not need to be triggered. Prior art circuits of astable transistor multivibrator circuits usually contain a pair of transistors and a pair of equal valued capacitors one of which connects the collector of the first transistor of the pair with the base of the second transistor and the other one connects the collector of the second transistor to the base of said first transistor, and a pair of equal-valued resistors which are used to bias the bases of the first and second transistors. The resistance-capacitance combination indicated provides the time constant for the period of the non-sinusoidal signal. Where discrete components are used, the periodicity of the non-sinusoidal signal can be reasonably accurately reproduced. However when such arrangements are to be reduced to integrated circuit form, i.e., a monolithic circuit arrangement, neither the resistor nor capacitor value can be derived with a high degree of accuracy. Further, such an arrangement is not conducive to the use of a crystal for stabilization of the periodicity of the circuit.

One of the problems in building a stable oscillator circuit is to control the loop gain. This is particularly true where a crystal oscillator circuit is involved, because the circuit should then be designed so that the loop gain is always greater than one where the crystal is operating in the series-resonance mode. This is necessary to insure that the oscillator starts and runs properly. However, it should be noted that the loop gain should be less than one at any spurious frequency at which the crystal may be resonant.

It is an object of this invention to provide an astable crystal controlled circuit in which the loop gain is well controlled, and in which the loop gain may be readily calculated.

It is a further object of this invention to provide a monolithic astable circuit in which the frequency of operation is determined by the series resonance of a piezoelectric crystal.

it is another object of the invention that the effective resistance of the circuit at the spurious frequencies would always be much higher than the resistance at the fundamental frequency.

SUMMARY OF INVENTION

A monolithic astable circuit includes first and second transistors, the base of the first transistor being directly connected to the collector of the second transistor, and the base of the second transistor being directly connected to the collector of the first transistor. An amplitude limiting resistor is connected between the collectors of said first and second transistors. Each collector is connected through a separate diode arrangement to the positive circuit of a power source. The emitters are arranged for connection to a frequency determining component and each emitter is also connected to a current source which, in turn, is connected to ground or the common terminal of the power source.

BRIEF DESCRIPTION OF DRAWING(S)

FIG. 1 is a circuit diagram of a preferred embodiment of the invention in which the astable circuit is shown to be included within the dashed lines and designated by 2; the frequency determining component is represented by a crystal 22 is shown as a separate device connected to the emitters of transistors 14 and 16;

FIG. 2 is a circuit diagram of the equivalent circuit of crystal 22;

FIG. 3 is a frequency impedance diagram for the crystal 22 using the equivalent circuit of FIG. 2; and FIG. 4 is a phase angle versus frequency diagram of the crystal 22.

DETAILED DESCRIPTION OF INVENTION

Referring now to FIG. 1, it should be understood that the elements contained within the dotted lines labeled as block 2 may be provided in an integrated circuit format rather than as discrete components. For example, the circuit is well-suited to integration in a standard bipolar monolithic process. Where integrated circuit arrangements are made, it should be noted that diodes D1, D2, D3 and D4, as is standard practice for integrated circuits, would be formed using diode connected transistors. The anodes of diodes D1 and D3 are connected, respectively, via paths 6 and 8 to node 4 which in turn is connected via path 1 to the positive terminal of the voltage source having a voltage V+. The power source is not shown since such devices are well known and the value of voltage is not indicated since this value would be selected using standard engineering practices for the elements involved. The cathode of diode D1 is connected to the anode of diode D2 and the cathode of D2 is connected via path 10 to the collector of transistor 14. Similarly, the cathode of diode D3 is connected to the anode of diode D4 and the D4 cathode is connected via path 12 to the collector of transistor 16. Connected between the collectors of transistors 14 and 16 is resistor Ra. Further, the collector of transistor 14 is directly connected to the base of transistor 16; and the collector of transistor 16 is directly connected to the base of transistor 14. The frequency determining component is shown as crystal 22 and it is connected between the emitters of transistors 14 and 16 via paths 18 and 20 and the terminals 32 and 34; and the emitters 18 and 20, respectively, are connected to the respective input terminals of current sources 40 and 42. These current sources control the magnitude of the direct currents I1 and I2. While the preferred embodiment employs a piezoelectric crystal, it should be understood that other resonant circuit arrangements also could be used. For example, crystal 22 could be replaced by a LC circuit.

As was noted above, one of the problems in building a stable oscillator circuit is to control the loop gain. This is particularly true where the frequency determining component is a piezoelectric crystal. The circuit should be designed so that the loop gain is always greater than unity for the series operating frequency of the crystal. This is necessary to make sure that the oscillator circuit starts out and then continues to run. This circuit allows the loop gain to be controlled so that the loop gain will be less than unity for any of the spurious frequencies where there would also be some resonance. For the crystal oscillator circuit illustrated in FIG. 1, the loop gain is essentially the collector load impedance divided by the emitter circuit impedance. These impedances are as follows:

$$\text{Collector Load Impedance} = Ra\, Za/(Ra+Za) \quad (1)$$

Where $Za = Z1 + Z2 + Z3 + Z4$ and Z1, Z2, Z3 and Z4 are the respective impedances of diodes D1, D2, D3 and D4; and $$Z1 = Kt/qI1 \quad (2)$$

I1 = Collector-Emitter Current
K = Boltzmann's Constant
T = Absolute temperature in degrees Kelvin
q = Electron Charge $$\text{Emitter Circuit Impedance} = RS + R1 + R2 \quad (3)$$

Where
RS = Series Resistance of the crystal 22;
R1 and R2 are the emitter resistance re for transistors 14 and 16, respectively, and $$R1 = KT/qI1 \quad (4)$$

$$\text{Loop Gain} = \frac{\text{Collector Load Impedance}}{Rs + \frac{KT}{qI1} + \frac{KT}{qI1}} \quad (5)$$

Thus the collector load impedance of interest is resistive and at the series resonance frequency for the crystal, the series LRC circuit shown in FIG. 2 is series resonant and the impedance appearing across terminals 32 and 34 is substantially a value of resistor Rs, which is small.

In order to understand the manner in which the loop gain is controlled, it seems appropriate to take an example. For the example, assume that currents I1 and I2 are equal and are one milliampere. Further assume that the resistor Ra is equal to 400 ohms and that the absolute temperature is equal to 300° K. The equation (5) reduces to:

$$\text{Loop Gain} = 82/(Rs + 52) \quad (6)$$

Because of the direct connection, the collector voltage is at the same voltage as the base voltage. Therefore, the transistors cannot tolerate more than, say, 50 or 100 millivolts of AC signal on the collector, otherwise the AC signal will begin to forward bias the collector base junction. By using the diode arrangement as shown as a part of the collector load, and by appropriate selection of resistor Ra the oscillation amplitude is properly controlled. Thus, a carefully controlled impedance is obtained. This ensures that the loop gain is greater than 1 for small signals, but drops to a value less than 1 for large signals. In this case, the transistors are never driven to cut off which ensures good frequency stability. Referring to equation 5, it may be seen that the denominator will tend to infinity together with the numerator and the loop gain will stay the same. By putting in the resistor Ra the value of the numerator of the loop gain equation is limited which forces the loop gain toward unity as the oscillator starts and then begins to run. In making the computation for the loop gain based upon the parameters cited, it is seen that the loop gain will be equal to 82 divided by the series resonant resistance $R_s + 52$ so that the circuit will oscillate for any crystal with a series resonance resistance $R_s$ less than 30 ohms.

Referring now to FIG. 3, it may be seen that the relative impedance of the piezoelectric crystal is the resistance $R_s$ at the series resonance frequency of the branch $LCR_s$ of the equivalent circuit shown in FIG. 2. This impedance which is resistive is shown in FIG. 3 to be the lowest value of impedance for the crystal. Thus it may be seen that the spurious frequencies will have a higher impedance than the series resonant resistance of the crystal and the oscillator circuit shown in FIG. 1 will not oscillate at these spurious frequencies. The oscillator output signal is obtained as a differential voltage from the collectors of transistors 14 and 16 and would appear on paths 28 and 30.

While the circuit arrangement has been described using NPN transistors, it would be possible to employ PNP transistors in place of transistors 14 and 16. Also, a frequency determining component other than a piezoelectric crystal may be used. Other changes could be made by those skilled in the art. While the invention has been particularly shown and described with respect to the preferred embodiment, it will be understood that those skilled in the art may make changes in form and detail without departing from the spirit and scope of the invention.

What is claimed is:

1. An oscillator in which the loop gain is well controlled comprising:
    a source of direct current power having a positive and a ground terminal;
    first and second transistors having base, emitter and collector electrodes, the base of the first transistor being directly connected to the collector of the second transistor, and the base of the second transistor being directly connected to the collector of the first transistor;
    a current source having first and second input terminals arranged for connection to the emitters of said first and second transistors, respectively, and having a third terminal connected to said ground terminal;
    a frequency determining component having a pair of terminals the first one of the pair being connected to the emitter of said first transistor and the other terminal of the pair being connected to the emitter of said second transistor; and
    a collector load impedance comprising
    a first pair of diodes, the first diode of the pair having its anode connected to said positive terminal, and the second diode having its anode connected to the cathode of said first diode and its cathode connected to the collector of said first transistor;
    a second pair of diodes, the first diode of the second pair having its anode connected to said positive terminal, and the second diode of the second pair having its anode connected to the cathode of said first diode of said second pair and its cathode connected to the collector of said second transistor; and
    a resistor having one end thereof connected to the collector of said first transistor and the other end connected to the collector of said second transistor, said resistor performing the function of limiting the amplitude of oscillation and the value of said resistor being selected to obtain the desired amplitude.

2. An oscillator as in claim 1 wherein said frequency determining component is a piezoelectric crystal.

3. An oscillator as in claim 1 wherein said frequency determining component comprises an LC resonant circuit.

4. An oscillator as in claim 2 or 3 wherein said first and second transistors are of the NPN type.

5. An oscillator as in claim 4 wherein the collector load impedance and the first and second transistors are all formed on a bipolar monolithic circuit.

* * * * *

UNITED STATES PATENT AND TRADEMARK OFFICE
CERTIFICATE OF CORRECTION

PATENT NO. : 4,353,039

DATED : October 5, 1982

INVENTOR(S) : Christopher R. Huntley

It is certified that error appears in the above-identified patent and that said Letters Patent is hereby corrected as shown below:

On the title page, assignee should read

-- (73) Assignee: AEL Microtel, Ltd., British Columbia, Canada --.

Signed and Sealed this

Fifteenth Day of February 1983

[SEAL]

Attest:

Attesting Officer

GERALD J. MOSSINGHOFF

Commissioner of Patents and Trademarks